United States Patent
Wei et al.

(10) Patent No.: US 9,722,631 B2
(45) Date of Patent: Aug. 1, 2017

(54) METHOD AND APPARATUS FOR CALCULATING ESTIMATED DATA COMPRESSION RATIO

(71) Applicant: Huawei Technologies Co., Ltd., Shenzhen (CN)

(72) Inventors: Jiansheng Wei, Shenzhen (CN); Junhua Zhu, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/397,098

(22) Filed: Jan. 3, 2017

(65) Prior Publication Data

US 2017/0117918 A1    Apr. 27, 2017

Related U.S. Application Data

(63) Continuation of application No. PCT/CN2014/082077, filed on Jul. 11, 2014.

(51) Int. Cl.
*H03M 7/40* (2006.01)
*H03M 7/30* (2006.01)

(52) U.S. Cl.
CPC ........... *H03M 7/40* (2013.01); *H03M 7/6058* (2013.01)

(58) Field of Classification Search
CPC ........ H03M 7/40; H03M 7/6058; H03M 7/30; H03M 7/3079; H03M 7/3071; H04L 69/04
USPC ...................................... 341/65, 67; 707/693
See application file for complete search history.

(56) References Cited

U.S. PATENT DOCUMENTS

| | | | |
|---|---|---|---|
| 5,805,932 A | 9/1998 | Kawashima et al. | |
| 8,195,636 B2 | 6/2012 | Stager et al. | |
| 8,295,615 B2 | 10/2012 | Celi, Jr. | |
| 8,321,386 B1 | 11/2012 | Jobanputra et al. | |
| 8,615,499 B2 | 12/2013 | Chambliss et al. | |
| 8,650,163 B1 | 2/2014 | Harnik et al. | |
| 9,246,511 B2 * | 1/2016 | Kipnis | H03M 7/30 |
| 2013/0254441 A1 | 9/2013 | Kipnis et al. | |
| 2014/0195498 A1 * | 7/2014 | Asher | H03M 7/4037 |
| | | | 707/693 |
| 2014/0244604 A1 * | 8/2014 | Oltean | H03M 7/30 |
| | | | 707/693 |

FOREIGN PATENT DOCUMENTS

| CN | 1127558 A | 7/1996 |
|---|---|---|
| CN | 102890268 A | 1/2013 |

(Continued)

OTHER PUBLICATIONS

Foreign Communication From a Counterpart Application, PCT Application No. PCT/CN2014/082077, International Search Report dated Apr. 16, 2015, 4 pages.

(Continued)

*Primary Examiner* — Khai M Nguyen
(74) *Attorney, Agent, or Firm* — Conley Rose, P.C.

(57) ABSTRACT

A method and an apparatus for calculating an estimated data compression ratio relate to the field of data processing technologies. In the solutions, an estimated data compression ratio is calculated using a related indicator that represents a distribution pattern of symbols in a symbol sequence, where the related indicator that represents the distribution pattern of the symbols in the symbol sequence is relatively closely related to the estimated data compression ratio.

20 Claims, 3 Drawing Sheets

(56) References Cited

FOREIGN PATENT DOCUMENTS

| CN | 103152430 A | 6/2013 |
|---|---|---|
| JP | 2000259187 A | 9/2000 |
| NO | 2006056247 A1 | 6/2006 |

OTHER PUBLICATIONS

Foreign Communication From a Counterpart Application, PCT Application No. PCT/CN2014/082077, Written Opinion dated Apr. 16, 2015, 4 pages.

Partial English Translation and Abstract of Chinese Patent Application No. CN102890268, Jan. 23, 2013, 5 pages.

Partial English Translation and Abstract of Chinese Patent Application No. CN103152430, Jun. 12, 2013, 5 pages.

Partial English Translation and Abstract of Japanese Patent Application No. JP2000259187, Sep. 22, 2000, 10 pages.

Harnik, D., et al., "Estimation of Deduplication Ratios in Large Data Sets," 28th Symposium on Mass Storage Systems and Technologies, Apr. 16-20, 2012, 11 pages.

Kattan, A., et al., "Genetic-Programming based Prediction of Data Compression Saving," Artifical Evolution, Series vol. 5975, 2010, 11 pages.

Constantinescu, C., et al., "Quick Estimation of Data Compression and De-Duplication for Large Storage Systems," First International Conference on Data Compression, Communications and Processing, Jun. 21-24, 2011, pp. 98-102.

Culhane, W., et al., "Statistical Measures as Predictors of Compression Savings," May 2008, 37 pages.

Harnik, D., et al., "To Zip or not to Zip: Effective Resource Usage for Real-Time Compression," 11th USENIX conference on File and Storage Technologies, 2013, pp. 229-241.

Foreign Communication From a Counterpart Application, PCT Application No. PCT/CN2014/082077, English Translation of International Search Report dated Apr. 16, 2015, 2 pages.

Foreign Communication From a Counterpart Application, PCT Application No. PCT/CN2014/082077, English Translation of Written Opinion dated Apr. 16, 2015, 6 pages.

* cited by examiner

METHOD AND APPARATUS FOR CALCULATING ESTIMATED DATA COMPRESSION RATIO

CROSS-REFERENCE TO RELATED APPLICATIONS

This application is a continuation of International Application No. PCT/CN2014/082077, filed on Jul. 11, 2014, the disclosure of which is hereby incorporated by reference in its entirety.

TECHNICAL FIELD

The present disclosure relates to the field of data processing technologies, and in particular, to a method and an apparatus for calculating an estimated data compression ratio.

BACKGROUND

As information society develops, data volumes increase exponentially, and data compression is widely applied in various fields because of advantages that data compression can eliminate information redundancy and improve data transmission efficiency and storage resource usage.

In a data compression process, central processing unit (CPU) and memory resources need to be occupied, which negatively affects system performance to some extent. Data compressibility essentially depends on a redundancy characteristic of data itself, that is, not all data is suitable for compression. For example, existing studies indicate that compression of data having low redundancy causes higher computing overheads and a severe waste of system resources. Therefore, before data compression, technologies for determining whether data is suitable for compression become particularly important.

Currently, whether data is suitable for compression is determined according to an estimated compression ratio. However, current methods for calculating an estimated compression ratio have a disadvantage of relatively low accuracy.

SUMMARY

Embodiments of the present disclosure provide a method and an apparatus for calculating an estimated data compression ratio, to overcome a disadvantage of relatively low accuracy of current methods for calculating an estimated data compression ratio.

Specific technical solutions provided in the embodiments of the present disclosure are as follows According to a first aspect, a method for calculating an estimated data compression ratio is provided, including parsing to-be-compressed data to obtain a symbol sequence, obtaining a related indicator of the symbol sequence, where the related indicator is used to represent a distribution pattern of symbols in the symbol sequence, calculating, according to the related indicator, an estimated coding length obtained after the to-be-compressed data is coded using a specified coding mode, and using a ratio of the estimated coding length obtained by calculation to an initial length of the to-be-compressed data as an estimated compression ratio of the to-be-compressed data.

With reference to the first aspect, in a first possible implementation manner, the related indicator includes a cardinality of a symbol set and/or a symbol frequency set, where the symbol set includes all symbols that exist in the symbol sequence, and any two symbols in the symbol set are different, the cardinality of the symbol set is a quantity of all the symbols in the symbol set, and a frequency in the symbol frequency set is a quantity of times each symbol in the symbol set exists in the symbol sequence.

With reference to the first possible implementation manner of the first aspect, in a second possible implementation manner, the calculating, according to the related indicator, an estimated coding length obtained after the to-be-compressed data is coded using a specified coding mode includes calculating, according to the cardinality of the symbol set, a bit length that is needed when any symbol included in the symbol set is expressed using a fixed-length coding mode, where all bit lengths that are needed when the symbols in the symbol set are expressed using the fixed-length coding mode are equal, determining a product of the bit length obtained by calculation and a sum of all frequencies that are included in the symbol frequency set, and using the determined product as a first estimated coding length, where the first estimated coding length is an estimated coding length obtained when the to-be-compressed data is coded using the fixed-length coding mode, where all the bit lengths that are needed when all the symbols in the symbol set are expressed using the fixed-length coding mode are equal.

With reference to the first possible implementation manner of the first aspect, in a third possible implementation manner, the calculating, according to the related indicator, an estimated coding length obtained after the to-be-compressed data is coded using a specified coding mode includes calculating a second estimated coding length by recursively dividing the symbol frequency set, where the second estimated coding length is an estimated coding length obtained after the to-be-compressed data is coded using a Huffman coding mode.

With reference to the third possible implementation manner of the first aspect, in a fourth possible implementation manner, the calculating a second estimated coding length by recursively dividing the symbol frequency set includes recursively dividing the symbol frequency set when that the cardinality of the symbol set is greater than or equal to a preset division threshold, to obtain at least two frequency subsets obtained after recursive division is completed, for any frequency subset of the at least two frequency subsets, calculating an estimated coding length obtained when a specified quantity of symbols are expressed using the Huffman coding mode, where the specified quantity is a sum of all frequencies included in the any frequency subset, adding estimated coding lengths separately calculated for each frequency subset, to obtain a sum of the estimated coding lengths, and using the sum of the estimated coding lengths as the second estimated coding length.

With reference to the fourth possible implementation manner of the first aspect, in a fifth possible implementation manner, the recursively dividing the symbol frequency set, to obtain at least two frequency subsets obtained after recursive division is completed includes for each frequency subset obtained by division, repeatedly performing the following division processing, and stopping division until a cardinality of the frequency subset obtained by division is less than a preset cardinality threshold, or until a recursively dividing level quantity reaches a preset level quantity threshold dividing the symbol frequency set, to obtain two frequency subsets, and for each frequency subset, when a cardinality of the frequency subset is greater than or equal to the preset cardinality threshold, or that the recursively dividing level quantity is less than the preset level quantity threshold, returning and continuing to perform division processing on the frequency subset.

With reference to the fifth possible implementation manner of the first aspect, in a sixth possible implementation manner, the dividing the symbol frequency set, to obtain two frequency subsets includes determining all division manners used to divide the symbol frequency set, for each division manner, separately performing dividing the symbol frequency set using the division manner, to obtain two frequency subsets, and determining whether any frequency included in a first frequency subset of the obtained two frequency subsets is greater than or equal to any frequency included in a second frequency subset of the obtained two frequency subsets, determining specified division manners in all the division manners, where in any division manner of the specified division manners, any frequency included in a first frequency subset of obtained two frequency subsets is greater than or equal to any frequency included in a second frequency subset of the obtained two frequency subsets, for each division manner of the specified division manners, calculating a difference between a sum of all frequencies included in a first frequency subset of two frequency subsets obtained in this division manner and a sum of all frequencies included in a second frequency subset, determining a minimum difference in all obtained differences, and using two frequency subsets obtained by division in a division manner corresponding to the minimum difference, as the two frequency subsets obtained by dividing the symbol frequency set.

With reference to the fifth possible implementation manner of the first aspect, in a seventh possible implementation manner, the dividing the symbol frequency set, to obtain two frequency subsets includes sorting all frequencies included in the symbol frequency set, sequentially dividing, (N−1) times according to the following rule, the symbol frequency set obtained after sorting, where N is the cardinality of the symbol set using a frequency sorted in the first place in the symbol frequency set obtained after sorting, a frequency sorted in the $X^{th}$ place, and all frequencies sorted between the first place and the $X^{th}$ place, as a first frequency subset obtained by division for the $X^{th}$ time, where X is a positive integer that is greater than or equal to 1 and is less than or equal to N−1, and using a frequency sorted in the last place in the symbol frequency set obtained after sorting, and all frequencies sorted between the $X^{th}$ place and the last place, as a second frequency subset obtained by division for the $X^{th}$ time, calculating a difference between a sum of all frequencies included in a first frequency subset obtained by division for each time and a sum of all frequencies included in a second frequency subset, and using a first frequency subset and a second frequency subset obtained by division in a division manner corresponding to a minimum difference, as the two frequency subsets obtained by dividing the symbol frequency set.

With reference to any one of the fourth to the seventh possible implementation manners of the first aspect, in an eighth possible implementation manner, the calculating an estimated coding length obtained when a specified quantity of symbols are expressed using the Huffman coding mode includes for any frequency included in the any frequency subset, separately performing determining a recursively dividing level quantity corresponding to the frequency subset in which the any frequency is located, calculating, according to the determined recursively dividing level quantity and a cardinality of the frequency subset in which the any frequency is located, an estimated bit length that is needed when a symbol corresponding to the frequency is expressed using the Huffman coding mode, and using a product of the estimated bit length obtained by calculation and the any frequency as an estimated coding length obtained when a quantity of symbols are expressed using the Huffman coding mode, where the quantity is the any frequency, and using a total estimated coding length obtained when a quantity of symbols are expressed using the Huffman coding mode, as the estimated coding length obtained when the specified quantity of symbols are expressed using the Huffman coding mode, where the quantity is the sum of all the frequencies in the any frequency subset.

With reference to the first aspect or any one of the first to the eighth possible implementation manners of the first aspect, in a ninth possible implementation manner, a data type of the to-be-compressed data is binary data, and the related indicator further includes a cardinality of a token set, a token bit length, and a maximum run-length, where the token set includes a symbol that is in the symbol sequence and that is different from both neighboring symbols, and any symbol in each group of symbols that exist continuously and repeatedly, the cardinality of the token set is a quantity of all symbols in the token set, the token bit length is space overheads of any token in the token set, where bit lengths of tokens included in the token set are equal, a run-length included in a run-length set is a quantity of times a token included in the token set continuously exists at corresponding locations in the symbol sequence, and the maximum run-length is a maximum value of quantities of times each token continuously exists at corresponding locations in the symbol sequence.

With reference to the ninth possible implementation manner of the first aspect, in a tenth possible implementation manner, the calculating, according to the related indicator, an estimated coding length obtained after the to-be-compressed data is coded using a specified coding mode includes calculating a bit length that is needed when the maximum run-length is expressed using a run-length coding mode, where a bit length that is needed when each run-length in the run-length set is expressed using the run-length coding mode is equal to the bit length that is needed when the maximum run-length is expressed using the run-length coding mode, using a product of the cardinality of the token set and the calculated bit length that is needed when the maximum run-length is expressed using the run-length coding mode, as a calculated bit length that is needed when all run-lengths are expressed using the run-length coding mode, using a product of the token bit length and the cardinality of the token set as a calculated bit length of all the tokens, determining a sum of the calculated bit length of all the tokens, and the calculated bit length that is needed when all the run-lengths are expressed using the run-length coding mode, and using the sum of the bit lengths as a third estimated coding length, where the third estimated coding length is an estimated coding length obtained when the to-be-compressed data is coded using the run-length coding mode.

According to a second aspect, an apparatus for calculating an estimated data compression ratio is provided, including a parsing unit, configured to parse to-be-compressed data to obtain a symbol sequence, an obtaining unit, configured to obtain a related indicator of the symbol sequence, where the related indicator is used to represent a distribution pattern of symbols in the symbol sequence, a first calculation unit, configured to calculate, according to the related indicator, an estimated coding length obtained after the to-be-compressed data is coded using a specified coding mode, and a second calculation unit, configured to use a ratio of the estimated coding length obtained by calculation to an initial length of the to-be-compressed data as an estimated compression ratio of the to-be-compressed data.

With reference to the second aspect, in a first possible implementation manner, the related indicator obtained by the obtaining unit includes a cardinality of a symbol set and/or a symbol frequency set, where the symbol set includes all symbols that exist in the symbol sequence, and any two symbols in the symbol set are different, the cardinality of the symbol set is a quantity of all the symbols in the symbol set, and a frequency in the symbol frequency set is a quantity of times each symbol in the symbol set exists in the symbol sequence.

With reference to the first possible implementation manner of the second aspect, in a second possible implementation manner, the first calculation unit is configured to calculate, according to the cardinality of the symbol set, a bit length that is needed when any symbol included in the symbol set is expressed using a fixed-length coding mode, where all bit lengths that are needed when the symbols in the symbol set are expressed using the fixed-length coding mode are equal, determine a product of the bit length obtained by calculation and a sum of all frequencies that are included in the symbol frequency set, and use the determined product as a first estimated coding length, where the first estimated coding length is an estimated coding length obtained when the to-be-compressed data is coded using the fixed-length coding mode, where all the bit lengths that are needed when all the symbols in the symbol set are expressed using the fixed-length coding mode are equal.

With reference to the first possible implementation manner of the second aspect, in a third possible implementation manner, the first calculation unit is configured to calculate a second estimated coding length by recursively dividing the symbol frequency set, where the second estimated coding length is an estimated coding length obtained after the to-be-compressed data is coded using a Huffman coding mode.

With reference to the third possible implementation manner of the second aspect, in a fourth possible implementation manner, the calculating, by the first calculation unit, a second estimated coding length by recursively dividing the symbol frequency set is recursively dividing the symbol frequency set when the cardinality of the symbol set is greater than or equal to a preset division threshold, to obtain at least two frequency subsets obtained after recursive division is completed, for any frequency subset of the at least two frequency subsets, calculating an estimated coding length obtained when a specified quantity of symbols are expressed using the Huffman coding mode, where the specified quantity is a sum of all frequencies included in the any frequency subset, adding estimated coding lengths separately calculated for each frequency subset, to obtain a sum of the estimated coding lengths, and using the sum of the estimated coding lengths as the second estimated coding length.

With reference to the fourth possible implementation manner of the second aspect, in a fifth possible implementation manner, the recursively dividing, by the first calculation unit, the symbol frequency set, to obtain at least two frequency subsets obtained after recursive division is completed is for each frequency subset obtained by division, repeatedly performing the following division processing, and stopping division until a cardinality of the frequency subset obtained by division is less than a preset cardinality threshold, or until a recursively dividing level quantity reaches a preset level quantity threshold dividing the symbol frequency set, to obtain two frequency subsets, and for each frequency subset, when a cardinality of the frequency subset is greater than or equal to the preset cardinality threshold, or that the recursively dividing level quantity is less than the preset level quantity threshold, returning and continuing to perform division processing on the frequency subset.

With reference to the fifth possible implementation manner of the second aspect, in a sixth possible implementation manner, the dividing, by the first calculation unit, the symbol frequency set, to obtain two frequency subsets is determining all division manners used to divide the symbol frequency set, for each division manner, separately performing dividing the symbol frequency set using the division manner, to obtain two frequency subsets, and determining whether any frequency included in a first frequency subset of the obtained two frequency subsets is greater than or equal to any frequency included in a second frequency subset of the obtained two frequency subsets, determining specified division manners in all the division manners, where in any division manner of the specified division manners, any frequency included in a first frequency subset of obtained two frequency subsets is greater than or equal to any frequency included in a second frequency subset of the obtained two frequency subsets, for each division manner of the specified division manners, calculating a difference between a sum of all frequencies included in a first frequency subset of two frequency subsets obtained in this division manner and a sum of all frequencies included in a second frequency subset, determining a minimum difference in all obtained differences, and using two frequency subsets obtained by division in a division manner corresponding to the minimum difference, as the two frequency subsets obtained by dividing the symbol frequency set.

With reference to the fifth possible implementation manner of the second aspect, in a seventh possible implementation manner, the dividing, by the first calculation unit, the symbol frequency set, to obtain two frequency subsets is sorting all frequencies included in the symbol frequency set, sequentially dividing, (N−1) times according to the following rule, the symbol frequency set obtained after sorting, where N is the cardinality of the symbol set using a frequency sorted in the first place in the symbol frequency set obtained after sorting, a frequency sorted in the $X^{th}$ place, and all frequencies sorted between the first place and the $X^{th}$ place, as a first frequency subset obtained by division for the $X^{th}$ time, where X is a positive integer that is greater than or equal to 1 and is less than or equal to N−1, and using a frequency sorted in the last place in the symbol frequency set obtained after sorting, and all frequencies sorted between the $X^{th}$ place and the last place, as a second frequency subset obtained by division for the $X^{th}$ time, calculating a difference between a sum of all frequencies included in a first frequency subset obtained by division for each time and a sum of all frequencies included in a second frequency subset, and using a first frequency subset and a second frequency subset obtained by division in a division manner corresponding to a minimum difference, as the two frequency subsets obtained by dividing the symbol frequency set.

With reference to any one of the fourth to the seventh possible implementation manners of the second aspect, in an eighth possible implementation manner, the calculating, by the first calculation unit, an estimated coding length obtained when a specified quantity of symbols are expressed using the Huffman coding mode is for any frequency included in the any frequency subset, separately performing determining a recursively dividing level quantity corresponding to the frequency subset in which the any frequency is located, calculating, according to the determined recursively dividing level quantity and a cardinality of the frequency subset in which the any frequency is located, an estimated bit length that is needed when a symbol corresponding to the frequency is expressed using the Huffman coding mode, and using a product of the estimated bit length obtained by calculation and the any frequency as an estimated coding length obtained when a quantity of symbols are expressed using the Huffman coding mode, where the quantity is the any frequency, and using a total estimated coding length obtained when a quantity of symbols are expressed using the Huffman coding mode, as the estimated coding length obtained when the specified quantity of symbols are expressed using the Huffman coding mode, where the quantity is the sum of all the frequencies in the any frequency subset.

With reference to the second aspect or any one of the first to the eighth possible implementation manners of the second aspect, in a ninth possible implementation manner, a data type of the to-be-compressed data is binary data, and the related indicator obtained by the obtaining unit further includes a cardinality of a token set, a token bit length, and a maximum run-length, where the token set includes a symbol that is in the symbol sequence and that is different from both neighboring symbols, and any symbol in each group of symbols that exist continuously and repeatedly, the cardinality of the token set is a quantity of all symbols in the token set, the token bit length is space overheads of any token in the token set, where bit lengths of tokens included in the token set are equal, a run-length included in a run-length set is a quantity of times a token included in the token set continuously exists at corresponding locations in the symbol sequence, and the maximum run-length is a maximum value of quantities of times each token continuously exists at corresponding locations in the symbol sequence.

With reference to the ninth possible implementation manner of the second aspect, in a tenth possible implementation manner, the first calculation unit is configured to calculate a bit length that is needed when the maximum run-length is expressed using a run-length coding mode, where a bit length that is needed when each run-length in the run-length set is expressed using the run-length coding mode is equal to the bit length that is needed when the maximum run-length is expressed using the run-length coding mode, use a product of the cardinality of the token set and the calculated bit length that is needed when the maximum run-length is expressed using the run-length coding mode, as a calculated bit length that is needed when all run-lengths are expressed using the run-length coding mode, use a product of the token bit length and the cardinality of the token set as a calculated bit length of all the tokens, determine a sum of the calculated bit length of all the tokens, and the calculated bit length that is needed when all the run-lengths are expressed using the run-length coding mode, and use the sum of the bit lengths as a third estimated coding length, where the third estimated coding length is an estimated coding length obtained when the to-be-compressed data is coded using the run-length coding mode.

In the prior art, an estimated data compression ratio is calculated according to a standard deviation of frequencies of symbols, or according to a standard deviation of exclusive OR values and a standard deviation of differences of continuous symbols, however, a standard deviation of frequencies of symbols or a standard deviation of exclusive OR values and a standard deviation of differences of continuous symbols is relatively not closely related to a compression ratio. Therefore, the current method for calculating an estimated data compression ratio has a disadvantage of relatively low accuracy. The embodiments of the present disclosure provide a method for calculating an estimated data compression ratio, where the method includes parsing to-be-compressed data to obtain a symbol sequence, obtaining a related indicator of the symbol sequence, where the related indicator is used to represent a distribution pattern of symbols in the symbol sequence, calculating, according to the related indicator, an estimated coding length obtained after the to-be-compressed data is coded using a specified coding mode, and using a ratio of the estimated coding length obtained by calculation to an initial length of the to-be-compressed data as an estimated compression ratio of the to-be-compressed data. In this solution, an estimated data compression ratio is calculated using a related indicator that represents a distribution pattern of symbols in a symbol sequence, where the related indicator that represents the distribution pattern of the symbols in the symbol sequence is relatively closely related to the estimated data compression ratio, and moreover, a technical characteristic of a compression coding method is considered in a calculation process, thereby overcoming a disadvantage of relatively low accuracy of a current method for calculating an estimated data compression ratio.

DESCRIPTION OF EMBODIMENTS

Figure 1:
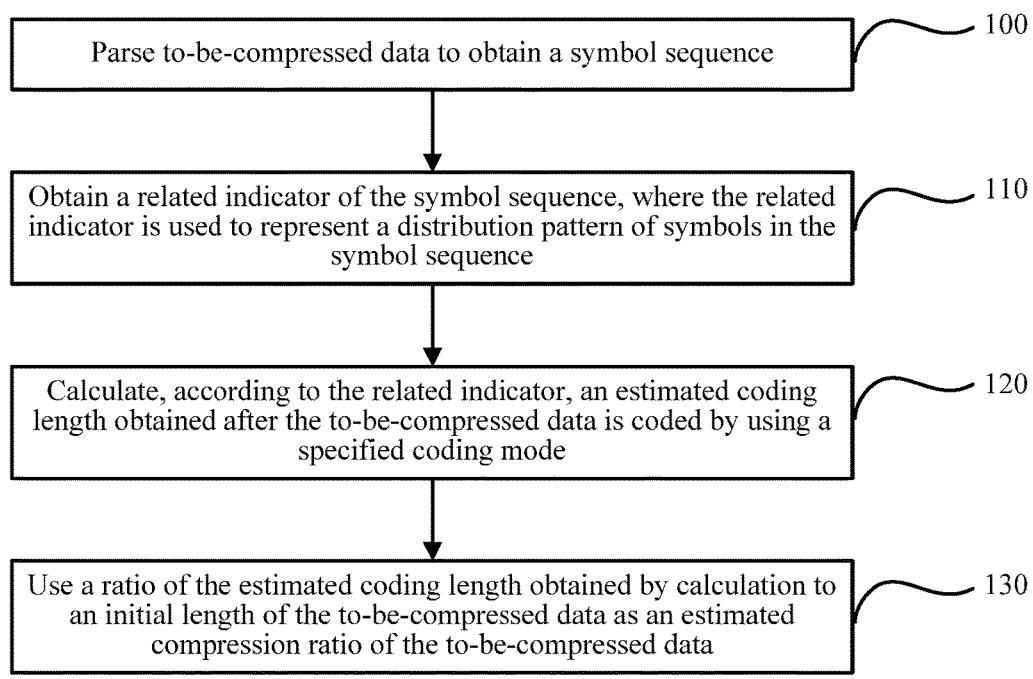
FIG. 1 is a detailed flowchart of calculating an estimated data compression ratio according to an embodiment of the present disclosure.

To make the objectives, technical solutions, and advantages of the embodiments of the present disclosure clearer, the following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

In addition, the terms "system" and "network" may be used interchangeably in this specification. The term "and/or" in this specification describes only an association relationship for describing associated objects and represents that three relationships may exist. For example, A and/or B may represent the following three cases Only A exists, both A and B exist, and only B exists. In addition, the character "/" in this specification generally indicates an "or" relationship between the associated objects.

Before data compression, whether to-be-compressed data is suitable for compression processing needs to be first determined, and whether the data is to be compressed is determined according to a determining result. Data compressibility essentially depends on a redundancy characteristic of the data itself. In an existing process, an estimated data compression ratio is calculated according to a standard deviation of frequencies of symbols, or according to a standard deviation of exclusive OR values and a standard deviation of differences of continuous symbols. However, a standard deviation of frequencies of symbols or a standard deviation of exclusive OR values and a standard deviation of differences of continuous symbols is relatively not closely related to a compression ratio. Therefore, the current method for calculating an estimated data compression ratio has a disadvantage of relatively low accuracy. To overcome a disadvantage of relatively low accuracy of the current method for calculating an estimated data compression ratio, the embodiments of the present disclosure provide a method for calculating an estimated data compression ratio. In this method, to-be-compressed data is parsed to obtain a symbol sequence, a related indicator of the symbol sequence is obtained, where the related indicator is used to represent a distribution pattern of symbols in the symbol sequence, an estimated coding length obtained after the to-be-compressed data is coded using a specified coding mode is calculated according to the related indicator, and a ratio of the estimated coding length obtained by calculation to an initial length of the to-be-compressed data is used as an estimated compression ratio of the to-be-compressed data. In this solution, an estimated data compression ratio is calculated using a related indicator that represents a distribution pattern of symbols in a symbol sequence, where the related indicator that represents the distribution pattern of the symbols in the symbol sequence is relatively closely related to the estimated data compression ratio, thereby overcoming a disadvantage of relatively low accuracy of a current process for calculating an estimated data compression ratio.

In the following, preferred embodiments manners of the present disclosure are described in detail with reference to the accompanying drawings. It should be understood that the preferred embodiments described herein are merely used to illustrate and explain the present disclosure, but are not intended to limit the present disclosure. In addition, the embodiments of the present application and features in the embodiments may be mutually combined in a case in which they do not conflict with each other.

In the following, the preferred implementation manners of the present disclosure are described in detail with reference to the accompanying drawings.

Referring to FIG. 1, in an embodiment of the present disclosure, a detailed procedure for calculating an estimated data compression ratio is as follows:

Step 100: Parse to-be-compressed data to obtain a symbol sequence.

Step 110: Obtain a related indicator of the symbol sequence, where the related indicator is used to represent a distribution pattern of symbols in the symbol sequence.

Step 120: Calculate, according to the related indicator, an estimated coding length obtained after the to-be-compressed data is coded using a specified coding mode.

Step 130: Use a ratio of the estimated coding length obtained by calculation to an initial length of the to-be-compressed data as an estimated compression ratio of the to-be-compressed data.

In this embodiment of the present disclosure, there are multiple forms of the related indicator, and, may include a cardinality of a symbol set and/or a symbol frequency set.

The symbol set includes all symbols that exist in the symbol sequence, and any two symbols in the symbol set are different.

The cardinality of the symbol set is a quantity of all the symbols in the symbol set.

A frequency in the symbol frequency set is a quantity of times each symbol in the symbol set exists in the symbol sequence.

For example, a symbol sequence is (ABBCCCDDDDDEEEEEEFFFFFFGGGGGGGGACAEAG). Therefore, a symbol set of this symbol sequence is (ABCDEFG), and a symbol frequency set of this symbol sequence is (4244668). A frequency 4 located in the first place is a quantity of times a symbol A exists in the symbol sequence, a frequency 2 located in the second place is a quantity of times a symbol B exists in the symbol sequence, a frequency 4 located in the third place is a quantity of times a symbol C exists in the symbol sequence, a frequency 5 located in the fourth place is a quantity of times a symbol D exists in the symbol sequence, a frequency 6 located in the fifth place is a quantity of times a symbol E exists in the symbol sequence, a frequency 6 located in the sixth place is a quantity of times a symbol F exists in the symbol sequence, and a frequency 8 located in the seventh place is a quantity of times a symbol G exists in the symbol sequence.

In this embodiment of the present disclosure, the estimated coding length obtained after the to-be-compressed data is coded using the specified coding mode is calculated according to the related indicator in multiple manners, and, the following manner may be used calculating, according to the cardinality of the symbol set, a bit length that is needed when any symbol included in the symbol set is expressed using a fixed-length coding mode, where all bit lengths that are needed when the symbols in the symbol set are expressed using the fixed-length coding mode are equal, determining a product of the bit length obtained by calculation and a sum of all frequencies that are included in the symbol frequency set, and using the determined product as a first estimated coding length, where the first estimated coding length is an estimated coding length obtained when the to-be-compressed data is coded using the fixed-length coding mode.

For example, a symbol sequence is (ABBCCCDDDDDEEEEEEFFFFFFGGGGGGGGACAEAG), and (ABCDEFG) is a symbol set, and in this case, when the symbol sequence is coded by means of fixed-length coding, bit lengths occupied by the symbols after coding are equal, that is, when a symbol A, a symbol B, a symbol C, a symbol D, a symbol E, a symbol F, and a symbol G are expressed using the fixed-length coding mode, all occupied bit lengths are equal. A bit length that is occupied when any symbol in the symbol set is expressed using the fixed-length coding mode may be determined using a formula 1

$$n = \lceil \log_2 N \rceil \quad \text{(formula 1)},$$

where n is a bit length that is occupied when any symbol is expressed by using the fixed-length coding mode;

⌈ ⌉ indicates rounding up; and

N is the cardinality of the symbol set.

For example, $\log_2 N = 7.2$; therefore, $n = \lceil \log_2 N \rceil = 8$.

In a process of the foregoing embodiment, the first estimated coding length obtained when the to-be-compressed data is coded using the fixed-length coding mode is a product of 34 and $\lceil \log_2 7 \rceil$.

Certainly, the estimated coding length obtained after the to-be-compressed data is coded using the specified coding mode may further be calculated according to the related indicator using the following manner calculating a second estimated coding length by recursively dividing the symbol frequency set, where the second estimated coding length is an estimated coding length obtained after the to-be-compressed data is coded using a Huffman coding mode.

In this embodiment of the present disclosure, the second estimated coding length is calculated in multiple manners by recursively dividing the symbol frequency set, and, the following manner may be used recursively dividing the symbol frequency set when the cardinality of the symbol set is greater than or equal to a preset division threshold, to obtain at least two frequency subsets obtained after recursive division is completed, for any frequency subset of the at least two frequency subsets, calculating an estimated coding length obtained when a specified quantity of symbols are expressed using the Huffman coding mode, where the specified quantity is a sum of all frequencies included in the any frequency subset, adding estimated coding lengths separately calculated for each frequency subset, to obtain a sum of the estimated coding lengths, and using the sum of the estimated coding lengths as the second estimated coding length.

For example, a symbol frequency set is (4, 2, 2, 2, 1, 1, 1), and the symbol frequency set is divided by means of recursive division, and after recursive division is completed, four frequency subsets are obtained a frequency subset 1 (4, 2), a frequency subset 2 (2, 2), a frequency subset 3 (1), and a frequency subset 4 (1, 1). For the frequency subset 1, an estimated coding length 1 obtained when six symbols corresponding to the frequency subset 1 (4, 2) are expressed by means of Huffman coding is calculated. For the other three frequency subsets of the four frequency subsets, that is, the frequency subset 2 (2, 2), the frequency subset 3 (1), and the frequency subset 4 (1, 1), a corresponding estimated coding length 2, a corresponding estimated coding length 3, and a corresponding estimated coding length 4 are all calculated according to the calculation process of the frequency subset 1. A sum obtained by adding the estimated coding length 1, the estimated coding length 2, the estimated coding length 3, and the estimated coding length 4 is calculated. The sum obtained by adding is used as the second estimated coding length.

In this embodiment of the present disclosure, the symbol frequency set is recursively divided in multiple manners, to obtain the at least two frequency subsets obtained after recursive division is completed, and, the following manner may be used for each frequency subset obtained by division, repeatedly performing the following division processing, and stopping division until a cardinality of the frequency subset obtained by division is less than a preset cardinality threshold, or until a recursively dividing level quantity reaches a preset level quantity threshold dividing the symbol frequency set, to obtain two frequency subsets, and for each frequency subset, when a cardinality of the frequency subset is greater than or equal to the preset cardinality threshold, or that the recursively dividing level quantity is less than the preset level quantity threshold, returning and continuing to perform division processing on the frequency subset.

For example, a symbol frequency set is (4, 3, 3, 3, 2, 2, 2, 1, 1, 1), and two frequency subsets obtained by division for the first time, that is, two frequency subsets obtained by first-level division are (4, 3, 3) and (3, 2, 2, 2, 1, 1, 1). Then division is performed for the second time, and (4, 3, 3) is divided into two frequency subsets (4) and (3, 3), and (3, 2, 2, 2, 1, 1, 1) is divided into two frequency subsets (3, 2) and (2, 2, 1, 1, 1), that is, four frequency subsets obtained by second-level division are (4), (3, 3), (3, 2), and (2, 2, 1, 1, 1). Assuming that none of (4), (3, 3), (3, 2), and (2, 2, 1, 1, 1) can be divided any longer, and recursive division is completed, in this case, the at least two frequency subsets obtained after the symbol frequency set is recursively divided and recursive division is completed are (4), (3, 3), (3, 2), and (2, 2, 1, 1, 1). If (2, 2, 1, 1, 1) can further be divided into (2, 2) and (1, 1, 1), that is, two frequency subsets obtained by third-level division are (2, 2) and (1, 1, 1), and recursive division is completed, the at least two frequency subsets obtained after the symbol frequency set is recursively divided and recursive division is completed are (4), (3, 3), (3, 2), (2, 2), and (1, 1, 1).

In this embodiment of the present disclosure, the symbol frequency set is divided in multiple manners to obtain two frequency subsets, and, the following manner may be used determining all division manners used to divide the symbol frequency set, for each division manner, separately performing dividing the symbol frequency set using the division manner, to obtain two frequency subsets, and determining whether any frequency included in a first frequency subset of the obtained two frequency subsets is greater than or equal to any frequency included in a second frequency subset of the obtained two frequency subsets, determining specified division manners in all the division manners, where in any division manner of the specified division manners, any frequency included in a first frequency subset of obtained two frequency subsets is greater than or equal to any frequency included in a second frequency subset of the obtained two frequency subsets, for each division manner of the specified division manners, calculating a difference between a sum of all frequencies included in a first frequency subset of two frequency subsets obtained in this division manner and a sum of all frequencies included in a second frequency subset, determining a minimum difference in all obtained differences, and using two frequency subsets obtained by division in a division manner corresponding to the minimum difference, as the two frequency subsets obtained by dividing the symbol frequency set.

In this embodiment of the present disclosure, the dividing the symbol frequency set, to obtain two frequency subsets includes sorting all frequencies included in the symbol frequency set, sequentially dividing, (N−1) times according to the following rule, the symbol frequency set obtained after sorting, where N is the cardinality of the symbol set using a frequency sorted in the first place in the symbol frequency set obtained after sorting, a frequency sorted in the $X^{th}$ place, and all frequencies sorted between the first place and the $X^{th}$ place, as a first frequency subset obtained by division for the $X^{th}$ time, where X is a positive integer that is greater than or equal to 1 and is less than or equal to N−1, and using a frequency sorted in the last place in the symbol frequency set obtained after sorting, and all frequencies sorted between the $X^{th}$ place and the last place, as a second frequency subset obtained by division for the $X^{th}$ time, calculating a difference between a sum of all frequencies included in a first frequency subset obtained by division for each time and a sum of all frequencies included in a second frequency subset, and using a first frequency subset and a second frequency subset obtained by division in a division manner corresponding to a minimum difference, as the two frequency subsets obtained by dividing the symbol frequency set.

In this embodiment of the present disclosure, the estimated coding length obtained when the specified quantity of symbols are expressed using the Huffman coding mode is calculated in multiple manners, and, the following manner may be used for any frequency included in the any frequency subset, separately performing determining a recursively dividing level quantity corresponding to the frequency subset in which the any frequency is located, calculating, according to the determined recursively dividing level quantity and a cardinality of the frequency subset in which the any frequency is located, an estimated bit length that is needed when a symbol corresponding to the frequency is expressed using the Huffman coding mode, and using a product of the estimated bit length obtained by calculation and the any frequency as an estimated coding length obtained when a quantity of symbols are expressed using the Huffman coding mode, where the quantity is the any frequency, and using a total estimated coding length obtained when a quantity of symbols are expressed using the Huffman coding mode, as the estimated coding length obtained when the specified quantity of symbols are expressed using the Huffman coding mode, where the quantity is the sum of all the frequencies in the any frequency subset.

In this embodiment of the present disclosure, the estimated bit length that is needed when the symbol corresponding to the frequency is expressed using the Huffman coding mode is calculated in multiple manners according to the determined recursively dividing level quantity and the cardinality of the frequency subset in which the any frequency is located, and, the following manner may be used using the determined recursively dividing level quantity as a first bit length that is needed when the symbol corresponding to the frequency is expressed using the Huffman coding mode, calculating, according to the cardinality of the frequency subset in which the any frequency is located, a second bit length that is needed when the symbol corresponding to the frequency is expressed using the Huffman coding mode, and using a sum of the calculated first bit length and second bit length as the estimated bit length that is needed when the symbol corresponding to the frequency is expressed using the Huffman coding mode.

For example, if the recursively dividing level quantity is three, the first bit length is 3. The second bit length that is needed when the symbol corresponding to the any frequency is expressed using the Huffman coding mode may be calculated using the formula 1 according to the cardinality of the frequency subset in which the frequency is located, and when calculation is performed using the formula 1, N is the cardinality of the frequency subset in which the any frequency is located, and n is the second bit length.

In this embodiment of the present disclosure, a data type of the to-be-compressed data is binary data, and the related indicator further includes a cardinality of a token set, a token bit length, and a maximum run-length, where the token set includes a symbol that is in the symbol sequence and that is different from both neighboring symbols, and any symbol in each group of symbols that exist continuously and repeatedly, the cardinality of the token set is a quantity of all symbols in the token set, the token bit length is space overheads of any token in the token set, where bit lengths of tokens included in the token set are equal, a run-length included in a run-length set is a quantity of times a token included in the token set continuously exists at corresponding locations in the symbol sequence, and the maximum run-length is a maximum value of quantities of times each token continuously exists at corresponding locations in the symbol sequence.

That is, in this embodiment of the present disclosure, a token is a symbol that is in the symbol sequence and that is different from a previous neighboring symbol, tokens that are not neighboring to each other may be a same symbol, a run-length is a quantity of times a token continuously and repeatedly exists, the symbol set includes the symbols that exist in the symbol sequence, and any two symbols in the symbol set are different.

For example, a symbol sequence is (ABBCCDDDDDEEEEEFFFFFFGGGGGGGACAEAG), a token set is (ABCDEFGACAEAG), a run-length of a token A located in the first place in the token set is 1, a run-length of a token B located in the second place in the token set is 2, a run-length of a token C located in the third place in the token set is 3, a run-length of a token D located in the fourth place in the token set is 4, a run-length of a token E located in the fifth place in the token set is 5, a run-length of a token F located in the sixth place in the token set is 6, a run-length of a token G located in the seventh place in the token set is 7, a run-length of a token A located in the eighth place in the token set is 1, a run-length of a token C located in the ninth place in the token set is 1, a run-length of a token A located in the tenth place in the token set is 1, a run-length of a token E located in the eleventh place in the token set is 1, a run-length of a token A located in the twelfth place in the token set is 1, and a run-length of a token G located in the thirteenth place in the token set is 1.

In this case, the estimated coding length obtained after the to-be-compressed data is coded using the specified coding mode may be calculated according to the related indicator using the following manner calculating a bit length that is needed when the maximum run-length is expressed using a run-length coding mode, where a bit length that is needed when each run-length in the run-length set is expressed using the run-length coding mode is equal to the bit length that is needed when the maximum run-length is expressed using the run-length coding mode, using a product of the cardinality of the token set and the calculated bit length that is needed when the maximum run-length is expressed using the run-length coding mode, as a calculated bit length that is needed when all run-lengths are expressed using the run-length coding mode, using a product of the token bit length and the cardinality of the token set as a calculated bit length of all the tokens, determining a sum of the calculated bit length of all the tokens, and the calculated bit length that is needed when all the run-lengths are expressed using the run-length coding mode, and using the sum of the bit lengths as a third estimated coding length, where the third estimated coding length is an estimated coding length obtained when the to-be-compressed data is coded using the run-length coding mode.

In this embodiment of the present disclosure, the bit length that is needed when the maximum run-length is expressed using the run-length coding mode may be calculated using the formula 1, where N is the maximum run-length. For example, a symbol sequence is ABBCCDDDDDEEEEEFFFFFFGGGGGGGACAEAG, and in this case, the maximum run-length is 7, and the bit length that is needed when each run-length is expressed using the run-length coding mode is $\lceil \log_2 7 \rceil$.

In this embodiment of the present disclosure, the ratio of the estimated coding length obtained by calculation to the initial length of the to-be-compressed data may be used as the estimated compression ratio of the to-be-compressed data using the following manner determining a preset length of any symbol included in the symbol sequence, where preset lengths of the symbols included in the symbol sequence are equal, using a product of the determined preset length and a sum of all the frequencies included in the symbol frequency set, as the initial length of the to-be-compressed data, and using a ratio of the first estimated coding length obtained by calculation to the initial length as a first estimated compression ratio of the to-be-compressed data, or using a ratio of the second estimated coding length obtained by calculation to the initial length as a second estimated compression ratio of the to-be-compressed data, or using a ratio of the third estimated coding length obtained by calculation to the initial length as a third estimated compression ratio of the to-be-compressed data.

In this embodiment of the present disclosure, after the ratio of the estimated coding length obtained by calculation to the initial length of the to-be-compressed data is used as the estimated compression ratio of the to-be-compressed data, the following operation is further included when the estimated compression ratio reaches a preset compression ratio threshold, performing compression processing on the to-be-compressed data using the specified coding mode.

In this embodiment of the present disclosure, when the estimated compression ratio reaches a preset compression ratio threshold, compression processing may be performed on the to-be-compressed data using the specified coding mode using the following manner when the first estimated compression ratio reaches the preset compression ratio threshold, performing compression processing on the to-be-compressed data using the fixed-length coding mode, or when the second estimated compression ratio reaches the preset compression ratio threshold, performing compression processing on the to-be-compressed data using the Huffman coding mode, or when the third estimated compression ratio reaches the preset compression ratio threshold, performing compression processing on the to-be-compressed data using the run-length coding mode.

In this embodiment of the present disclosure, after the estimated coding length obtained after the to-be-compressed data is coded using the specified coding mode is calculated according to the related indicator, the following operations may further be included calculating, according to the cardinality of the symbol set, a bit length that is needed when any symbol included in the token set is expressed using the fixed-length coding mode, determining a product of the calculated bit length and the cardinality of the token set, and using the product as a fourth estimated coding length, where the fourth estimated coding length is an estimated coding length obtained when the token set is coded using the fixed-length coding mode, determining a preset length of any token included in the token set, where preset lengths of tokens included in the token set are equal, using a product of the determined preset length and the cardinality of the token set as an initial length of the token set, and using a ratio of the fourth estimated coding length obtained by calculation to the initial length of the token set as an estimated compression ratio of the token set.

In this embodiment of the present disclosure, when the estimated compression ratio reaches a preset compression ratio threshold, compression processing may be performed on the to-be-compressed data using the specified coding mode using the following operations calculating a ratio of a bit length that is needed when all tokens are expressed using the run-length coding mode to the third estimated coding length, and when a product of the third estimated compression ratio, the ratio, and the estimated compression ratio of the token set reaches a preset compression ratio threshold, performing compression processing on the to-be-compressed data using the run-length coding mode and the fixed-length coding mode.

In this embodiment of the present disclosure, after the estimated coding length obtained after the to-be-compressed data is coded using the specified coding mode is calculated according to the related indicator, the following operations may further be included determining the symbol frequency set of the token set, calculating a fifth estimated coding length by recursively dividing the determined symbol frequency set of the token set, where the fifth estimated coding length is an estimated coding length obtained after the token set is coded using the Huffman coding mode, determining a preset length of any token included in the token set, where preset lengths of tokens included in the token set are equal, using a product of the determined preset length and the cardinality of the token set as an initial length of the token set, and using a ratio of the fifth estimated coding length obtained by calculation to the initial length of the token set as an estimated compression ratio of the token set.

In this embodiment of the present disclosure, when the estimated compression ratio reaches a preset compression ratio threshold, compression processing may be performed on the to-be-compressed data using the specified coding mode using the following manner determining a ratio of the calculated bit length that is needed when all tokens are expressed using the run-length coding mode to the third estimated coding length, and when a product of the third estimated compression ratio, the ratio, and the estimated compression ratio of the token set reaches a preset compression ratio threshold, performing compression processing on the to-be-compressed data using the run-length coding mode and the Huffman coding mode.

In this embodiment of the present disclosure, when a data type of the to-be-compressed data is text data, the related indicator further includes a cardinality of a symbol pair set and/or a symbol pair frequency set, where the symbol pair set includes a set that includes a symbol pair that exists in the symbol sequence, any two symbol pairs in the symbol pair set are different, and any symbol pair is any two neighboring symbols in the symbol sequence, a cardinality of the symbol pair set is a quantity of symbol pairs included in the symbol pair set, and the symbol pair frequency set includes a quantity of times each symbol pair in the symbol pair set exists in the symbol sequence.

In this embodiment of the present disclosure, the estimated coding length obtained after the to-be-compressed data is coded using the specified coding mode may be calculated according to the related indicator using the following manner calculating, according to the cardinality of the symbol pair set, a bit length that is needed when any symbol pair included in the symbol pair set is expressed using the fixed-length coding mode, determining a product of the bit length obtained by calculation and a sum of all frequencies that are included in the symbol pair frequency set, and using the product as a sixth estimated coding length, where the sixth estimated coding length is an estimated coding length obtained when the to-be-compressed data is coded using the fixed-length coding mode, where all the bit lengths that are needed when all the symbol pairs in the symbol pair set are expressed using the fixed-length coding mode are equal.

In this embodiment of the present disclosure, the estimated coding length obtained after the to-be-compressed data is coded using the specified coding mode is calculated according to the related indicator in multiple manners, and the following manner may be used calculating a seventh estimated coding length by recursively dividing the symbol pair frequency set, where the seventh estimated coding length is an estimated coding length obtained after the to-be-compressed data is coded using a Huffman coding mode.

In this embodiment of the present disclosure, the seventh estimated coding length is calculated in multiple manners by recursively dividing the symbol pair frequency set, and the following manner may be used recursively dividing the symbol pair frequency set when the cardinality of the symbol pair set is greater than or equal to a preset division threshold, to obtain at least two frequency subsets obtained after recursive division is completed, for any frequency subset of the at least two frequency subsets, calculating an estimated coding length obtained when a specified quantity of symbol pairs are expressed using the Huffman coding mode, where the specified quantity is a sum of all frequencies included in the any frequency subset, adding estimated coding lengths separately calculated for each frequency subset, to obtain a sum of the estimated coding lengths, and using the sum of the estimated coding lengths as the seventh estimated coding length.

In this embodiment of the present disclosure, the symbol pair frequency set is recursively divided in multiple manners, to obtain the at least two frequency subsets obtained after recursive division is completed, and the following manner may be used for each frequency subset obtained by division, repeatedly performing the following division processing, and stopping division until a cardinality of the frequency subset obtained by division is less than a preset cardinality threshold, or until a recursively dividing level quantity reaches a preset level quantity threshold dividing the symbol pair frequency set, to obtain two frequency subsets, and for each frequency subset, when a cardinality of the frequency subset is greater than or equal to the preset cardinality threshold, or that the recursively dividing level quantity is less than the preset level quantity threshold, returning and continuing to perform division processing on the frequency subset.

In this embodiment of the present disclosure, the symbol pair frequency set is divided in multiple manners to obtain two frequency subsets, and the following manner may be used determining all division manners used to divide the symbol pair frequency set, for each division manner, separately performing dividing the symbol pair frequency set using the division manner, to obtain two frequency subsets, and determining whether any frequency included in a first frequency subset of the obtained two frequency subsets is greater than or equal to any frequency included in a second frequency subset of the obtained two frequency subsets, determining specified division manners in all the division manners, where in any division manner of the specified division manners, any frequency included in a first frequency subset of obtained two frequency subsets is greater than or equal to any frequency included in a second frequency subset of the obtained two frequency subsets, for each division manner of the specified division manners, calculating a difference between a sum of all frequencies included in a first frequency subset of two frequency subsets obtained in this division manner and a sum of all frequencies included in a second frequency subset, determining a minimum difference in all obtained differences, and using two frequency subsets obtained by division in a division manner corresponding to the minimum difference, as the two frequency subsets obtained by dividing the symbol pair frequency set.

In this embodiment of the present disclosure, the symbol pair frequency set is divided in multiple manners to obtain two frequency subsets, and the following manner may be used sorting all frequencies included in the symbol pair frequency set, sequentially dividing, (N−1) times according to the following rule, the symbol pair frequency set obtained after sorting, where N is the cardinality of the symbol set using a frequency sorted in the first place in the symbol pair frequency set obtained after sorting, a frequency sorted in the $X^{th}$ place, and all frequencies sorted between the first place and the $X^{th}$ place, as a first frequency subset obtained by division for the $X^{th}$ time, where X is a positive integer that is greater than or equal to 1 and is less than or equal to N−1, and using a frequency sorted in the last place in the symbol pair frequency set obtained after sorting, and all frequencies sorted between the $X^{th}$ place and the last place, as a second frequency subset obtained by division for the $X^{th}$ time, calculating a difference between a sum of all frequencies included in a first frequency subset obtained by division for each time and a sum of all frequencies included in a second frequency subset, and using a first frequency subset and a second frequency subset obtained by division in a division manner corresponding to a minimum difference, as the two frequency subsets obtained by dividing the symbol pair frequency set.

In this embodiment of the present disclosure, the estimated coding length obtained when the specified quantity of symbol pairs are expressed using the Huffman coding mode is calculated in multiple manners, and the following manner may be used for any frequency included in the any frequency subset, separately performing determining a recursively dividing level quantity corresponding to the frequency subset in which the any frequency is located, calculating, according to the determined recursively dividing level quantity and a cardinality of the frequency subset in which the any frequency is located, an estimated bit length that is needed when a symbol pair corresponding to the frequency is expressed using the Huffman coding mode, and using a product of the estimated bit length obtained by calculation and the any frequency as an estimated coding length obtained when a quantity of symbol pairs are expressed using the Huffman coding mode, where the quantity is the any frequency, and using a total estimated coding length obtained when a quantity of symbol pairs are expressed using the Huffman coding mode, as the estimated coding length obtained when the specified quantity of symbol pairs are expressed using the Huffman coding mode, where the quantity is the sum of all the frequencies in the any frequency subset.

In this embodiment of the present disclosure, an estimated bit length that is needed when a symbol corresponding to the frequency is expressed using the Huffman coding mode is calculated in multiple manners according to the determined recursively dividing level quantity and a cardinality of the frequency subset in which the any frequency is located, and the following manner may be used using the determined recursively dividing level quantity as a first bit length that is needed when the symbol pair corresponding to the frequency is expressed using the Huffman coding mode, calculating, according to the cardinality of the frequency subset in which the any frequency is located, a second bit length that is needed when the symbol pair corresponding to the frequency is expressed using the Huffman coding mode, and using a sum of the calculated first bit length and second bit length as the estimated bit length that is needed when the symbol pair corresponding to the frequency is expressed using the Huffman coding mode.

For example, if the recursively dividing level quantity is three, the first bit length is 3. The second bit length that is needed when the symbol pair corresponding to the any frequency is expressed using the Huffman coding mode may be calculated using the formula 1 according to the cardinality of the frequency subset in which the frequency is located, and when calculation is performed using the formula 1, N is the cardinality of the frequency subset in which the any frequency is located, and n is the second bit length.

In this embodiment of the present disclosure, the ratio of the estimated coding length obtained by calculation to the initial length of the to-be-compressed data is used as the estimated compression ratio of the to-be-compressed data in multiple manners, and the following manner may be used determining a quantity of symbol pairs formed by a quantity of symbols in the symbol set, where the quantity is the cardinality of the symbol set, calculating a first bit length that is needed to express the determined quantity of symbol pairs, calculating a second bit length that is needed to express a quantity of symbol pairs, where the quantity is a sum of all the frequencies included in the symbol pair frequency set, using a product of a minimum value of the first bit length and the second bit length, and the sum of all the frequencies included in the symbol pair frequency set, as the initial length of the to-be-compressed data, and using a ratio of the sixth estimated coding length obtained by calculation to the initial length as a sixth estimated compression ratio of the to-be-compressed data, or using a ratio of the seventh estimated coding length obtained by calculation to the initial length as a seventh estimated compression ratio of the to-be-compressed data.

In this embodiment of the present disclosure, the first bit length that is needed to express the determined quantity of symbol pairs may be calculated using the formula 1, where N is the quantity of the symbol pairs, and n is the first bit length.

In this embodiment of the present disclosure, the second bit length that is needed to express the quantity of symbol pairs may also be calculated using the formula 1, where the quantity is the sum of all the frequencies included in the symbol pair frequency set, N is the sum of all the frequencies included in the symbol pair frequency set, and n is the second bit length.

For example, the cardinality of the symbol set is nine, and there are 81 symbol pairs formed by the nine symbols, therefore, the first bit length n1 is $\lceil \log_2 81 \rceil$, the sum of all the frequencies included in the symbol pair frequency set is 46, the second bit length n2 is $\lceil \log_2 46 \rceil$, and because n1 is greater than n2, a product of n2 and 46 is used as the initial length of the to-be-compressed data.

In this embodiment of the present disclosure, after the ratio of the estimated coding length obtained by calculation to the initial length of the to-be-compressed data is used as the estimated compression ratio of the to-be-compressed data, the following operation is further included when the estimated compression ratio reaches a preset compression ratio threshold, performing compression processing on the to-be-compressed data using the specified coding mode.

In this embodiment of the present disclosure, when the estimated compression ratio reaches the preset compression ratio threshold, compression processing is performed on the to-be-compressed data in multiple manners using the specified coding mode, and the following manner may be used when the sixth estimated compression ratio reaches the preset compression ratio threshold, performing compression processing on the to-be-compressed data using the fixed-length coding mode, or when the seventh estimated compression ratio reaches the preset compression ratio threshold, performing compression processing on the to-be-compressed data using the Huffman coding mode.

In this embodiment of the present disclosure, the determined preset length of any symbol included in the symbol sequence may be a preset length such as one byte or two bytes, and certainly may further change in another application scenario, and details are not described one by one herein.

Figure 2:
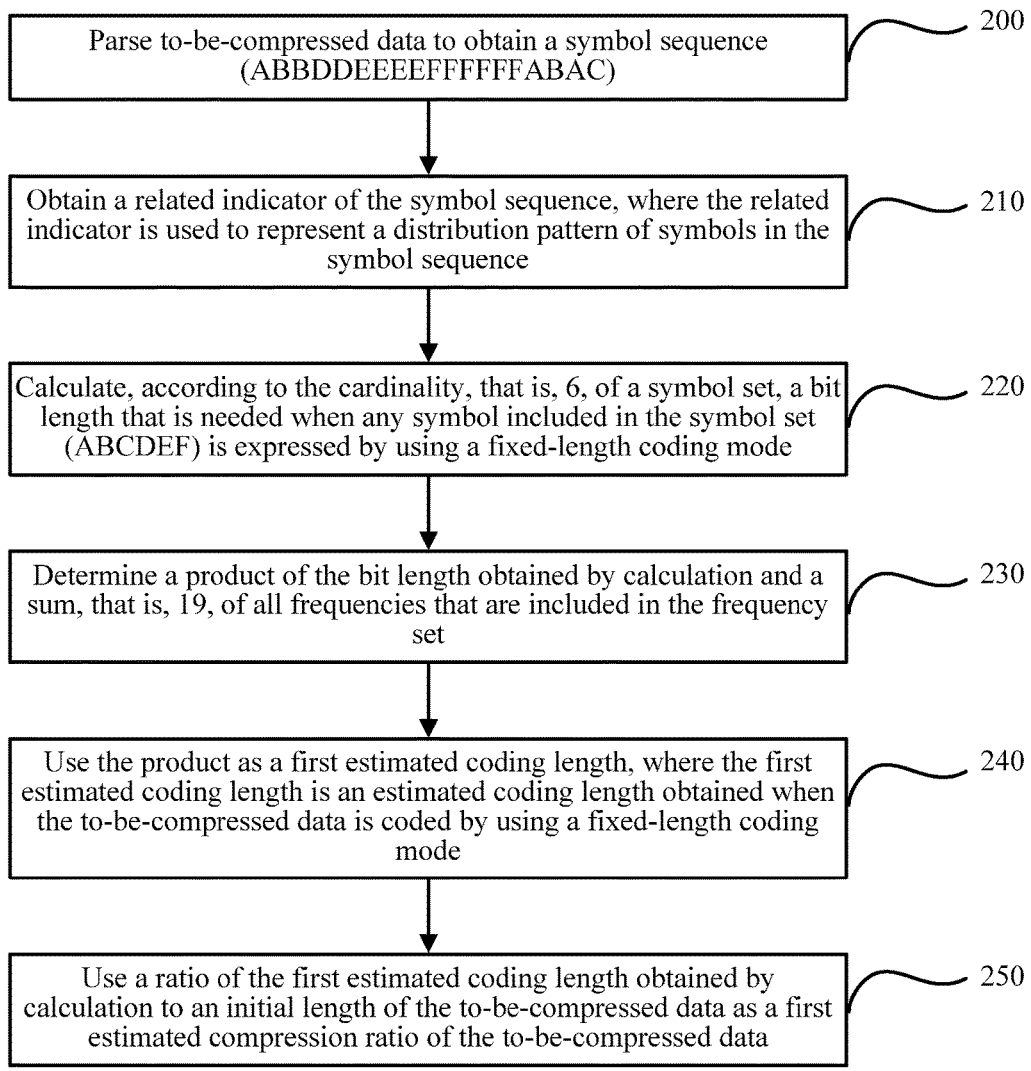
FIG. 2 is an embodiment of calculating an estimated data compression ratio according to an embodiment of the present disclosure.

To better understand this embodiment of the present disclosure, the following provides a specific application scenario, and describes a process for calculating an estimated data compression ratio in further detail, as shown in FIG. 2.

Step 200: Parse to-be-compressed data to obtain a symbol sequence (ABBDDEEEEFFFFFFABAC).

Step 210: Obtain a related indicator of the symbol sequence, where the related indicator is used to represent a distribution pattern of symbols in the symbol sequence.

In this step, the related indicator includes a cardinality of a symbol set, where the symbol set is (ABCDEF), the cardinality of the symbol set is 6, and a symbol frequency set is (3, 3, 1, 2, 4, 6).

Step 220: Calculate, according to the cardinality, that is, 6, of the symbol set, a bit length that is needed when any symbol included in the symbol set (ABCDEF) is expressed using a fixed-length coding mode.

In this step, bit lengths that are needed when the symbols in the symbol set (ABCDEF) are expressed using the fixed-length coding mode are equal, that is, bit lengths that are needed when the symbol A, the symbol B, the symbol C, the symbol D, the symbol E, and the symbol F are expressed using the fixed-length coding mode are equal.

Step 230: Determine a product of the bit length obtained by calculation and a sum, that is, 19, of all frequencies that are included in the frequency set.

Step 240: Use the product as a first estimated coding length, where the first estimated coding length is an estimated coding length obtained when the to-be-compressed data is coded using a fixed-length coding mode.

Step 250 Use a ratio of the first estimated coding length obtained by calculation to an initial length of the to-be-compressed data as a first estimated compression ratio of the to-be-compressed data.

Figure 3:
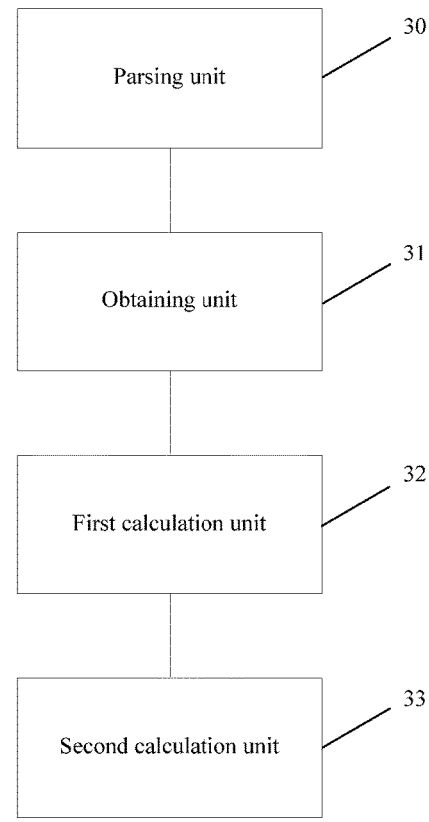
FIG. 3 is a functional schematic structural diagram of an apparatus for calculating an estimated data compression ratio according to an embodiment of the present disclosure.

Based on the foregoing technical solution, referring to FIG. 3, an embodiment of the present disclosure provides an apparatus for calculating an estimated data compression ratio, where the apparatus for calculating an estimated data compression ratio includes a parsing unit 30, an obtaining unit 31, a first calculation unit 32, and a second calculation unit 33.

The parsing unit 30 is configured to parse to-be-compressed data to obtain a symbol sequence.

The obtaining unit 31 is configured to obtain a related indicator of the symbol sequence, where the related indicator is used to represent a distribution pattern of symbols in the symbol sequence.

The first calculation unit 32 is configured to calculate, according to the related indicator, an estimated coding length obtained after the to-be-compressed data is coded using a specified coding mode.

The second calculation unit 33 is configured to use a ratio of the estimated coding length obtained by calculation to an initial length of the to-be-compressed data as an estimated compression ratio of the to-be-compressed data.

In this embodiment of the present disclosure, the related indicator obtained by the obtaining unit 31 includes a cardinality of a symbol set and/or a symbol frequency set, where the symbol set includes all symbols that exist in the symbol sequence, and any two symbols in the symbol set are different, the cardinality of the symbol set is a quantity of all the symbols in the symbol set, and a frequency in the symbol frequency set is a quantity of times each symbol in the symbol set exists in the symbol sequence.

In this embodiment of the present disclosure, the first calculation unit 32 is configured to calculate, according to the cardinality of the symbol set, a bit length that is needed when any symbol included in the symbol set is expressed using a fixed-length coding mode, where all bit lengths that are needed when the symbols in the symbol set are expressed using the fixed-length coding mode are equal, determine a product of the bit length obtained by calculation and a sum of all frequencies that are included in the symbol frequency set, and use the determined product as a first estimated coding length, where the first estimated coding length is an estimated coding length obtained when the to-be-compressed data is coded using the fixed-length coding mode, where all the bit lengths that are needed when all the symbols in the symbol set are expressed using the fixed-length coding mode are equal.

In this embodiment of the present disclosure, the first calculation unit 32 is configured to calculate a second estimated coding length by recursively dividing the symbol frequency set, where the second estimated coding length is an estimated coding length obtained after the to-be-compressed data is coded using a Huffman coding mode.

In this embodiment of the present disclosure, the calculating, by the first calculation unit 32, a second estimated coding length by recursively dividing the symbol frequency set is recursively dividing the symbol frequency set when the cardinality of the symbol set is greater than or equal to a preset division threshold, to obtain at least two frequency subsets obtained after recursive division is completed, for any frequency subset of the at least two frequency subsets, calculating an estimated coding length obtained when a specified quantity of symbols are expressed using the Huffman coding mode, where the specified quantity is a sum of all frequencies included in the any frequency subset, adding estimated coding lengths separately calculated for each frequency subset, to obtain a sum of the estimated coding lengths, and using the sum of the estimated coding lengths as the second estimated coding length.

In this embodiment of the present disclosure, the recursively dividing, by the first calculation unit 32, the symbol frequency set, to obtain at least two frequency subsets obtained after recursive division is completed is for each frequency subset obtained by division, repeatedly performing the following division processing, and stopping division until a cardinality of the frequency subset obtained by division is less than a preset cardinality threshold, or until a recursively dividing level quantity reaches a preset level quantity threshold dividing the symbol frequency set, to obtain two frequency subsets, and for each frequency subset, when a cardinality of the frequency subset is greater than or equal to the preset cardinality threshold, or that the recursively dividing level quantity is less than the preset level quantity threshold, returning and continuing to perform division processing on the frequency subset.

In this embodiment of the present disclosure, the dividing, by the first calculation unit 32, the symbol frequency set, to obtain two frequency subsets is determining all division manners used to divide the symbol frequency set, for each division manner, separately performing dividing the symbol frequency set using the division manner, to obtain two frequency subsets, and determining whether any frequency included in a first frequency subset of the obtained two frequency subsets is greater than or equal to any frequency included in a second frequency subset of the obtained two frequency subsets, determining specified division manners in all the division manners, where in any division manner of the specified division manners, any frequency included in a first frequency subset of obtained two frequency subsets is greater than or equal to any frequency included in a second frequency subset of the obtained two frequency subsets, for each division manner of the specified division manners, calculating a difference between a sum of all frequencies included in a first frequency subset of two frequency subsets obtained in this division manner and a sum of all frequencies included in a second frequency subset, determining a minimum difference in all obtained differences, and using two frequency subsets obtained by division in a division manner corresponding to the minimum difference, as the two frequency subsets obtained by dividing the symbol frequency set.

In this embodiment of the present disclosure, the dividing, by the first calculation unit 32, the symbol frequency set, to obtain two frequency subsets is sorting all frequencies included in the symbol frequency set, sequentially dividing, (N−1) times according to the following rule, the symbol frequency set obtained after sorting, where N is the cardinality of the symbol set using a frequency sorted in the first place in the symbol frequency set obtained after sorting, a frequency sorted in the $X^{th}$ place, and all frequencies sorted between the first place and the $X^{th}$ place, as a first frequency subset obtained by division for the $X^{th}$ time, where X is a positive integer that is greater than or equal to 1 and is less than or equal to N−1, and using a frequency sorted in the last place in the symbol frequency set obtained after sorting, and all frequencies sorted between the $X^{th}$ place and the last place, as a second frequency subset obtained by division for the $X^{th}$ time, calculating a difference between a sum of all frequencies included in a first frequency subset obtained by division for each time and a sum of all frequencies included in a second frequency subset, and using a first frequency subset and a second frequency subset obtained by division in a division manner corresponding to a minimum difference, as the two frequency subsets obtained by dividing the symbol frequency set.

In this embodiment of the present disclosure, the calculating, by the first calculation unit 32, an estimated coding length obtained when a specified quantity of symbols are expressed using the Huffman coding mode is for any frequency included in the any frequency subset, separately performing determining a recursively dividing level quantity corresponding to the frequency subset in which the any frequency is located, calculating, according to the determined recursively dividing level quantity and a cardinality of the frequency subset in which the any frequency is located, an estimated bit length that is needed when a symbol corresponding to the frequency is expressed using the Huffman coding mode, and using a product of the estimated bit length obtained by calculation and the any frequency as an estimated coding length obtained when a quantity of symbols are expressed using the Huffman coding mode, where the quantity is the any frequency, and using a total estimated coding length obtained when a quantity of symbols are expressed using the Huffman coding mode, as the estimated coding length obtained when the specified quantity of symbols are expressed using the Huffman coding mode, where the quantity is the sum of all the frequencies in the any frequency subset.

In this embodiment of the present disclosure, a data type of the to-be-compressed data is binary data, and the related indicator obtained by the obtaining unit 31 further includes a cardinality of a token set, a token bit length, and a maximum run-length, where the token set includes a symbol that is in the symbol sequence and that is different from both neighboring symbols, and any symbol in each group of symbols that exist continuously and repeatedly, the cardinality of the token set is a quantity of all symbols in the token set, the token bit length is space overheads of any token in the token set, where bit lengths of tokens included in the token set are equal, a run-length included in a run-length set is a quantity of times a token included in the token set continuously exists at corresponding locations in the symbol sequence, and the maximum run-length is a maximum value of quantities of times each token continuously exists at corresponding locations in the symbol sequence.

In this embodiment of the present disclosure, the first calculation unit 32 is configured to calculate a bit length that is needed when the maximum run-length is expressed using a run-length coding mode, where a bit length that is needed when each run-length in the run-length set is expressed using the run-length coding mode is equal to the bit length that is needed when the maximum run-length is expressed using the run-length coding mode, use a product of the cardinality of the token set and the calculated bit length that is needed when the maximum run-length is expressed using the run-length coding mode, as a calculated bit length that is needed when all run-lengths are expressed using the run-length coding mode, use a product of the token bit length and the cardinality of the token set as a calculated bit length of all the tokens, determine a sum of the calculated bit length of all the tokens, and the calculated bit length that is needed when all the run-lengths are expressed using the run-length coding mode, and use the sum of the bit lengths as a third estimated coding length, where the third estimated coding length is an estimated coding length obtained when the to-be-compressed data is coded using the run-length coding mode.

Figure 4:
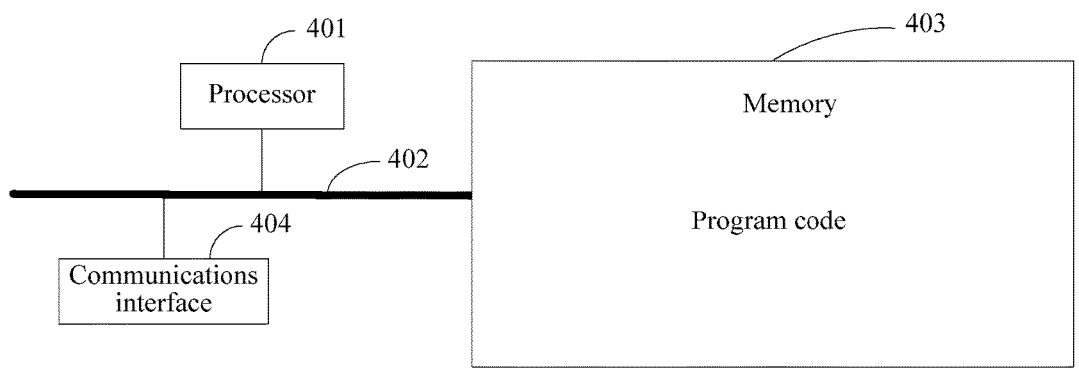
FIG. 4 is a schematic physical structural diagram of an apparatus for calculating an estimated data compression ratio according to an embodiment of the present disclosure.

FIG. 4 is a diagram of a physical apparatus of a network interface card according to an embodiment of the present disclosure, where the network interface card includes at least one processor 401, a communications bus 402, a memory 403, and at least one communications interface 404.

The communications bus 402 is configured to implement connection and communication between the foregoing components, and the communications interface 404 is configured to connect to and communicate with an external device.

The memory 403 is configured to store program code that needs to be executed, and when the processor 401 executes the program code in the memory 403, the processor 401 implements the following functions parsing to-be-compressed data to obtain a symbol sequence, obtaining a related indicator of the symbol sequence, where the related indicator is used to represent a distribution pattern of symbols in the symbol sequence, calculating, according to the related indicator, an estimated coding length obtained after the to-be-compressed data is coded using a specified coding mode, and using a ratio of the estimated coding length obtained by calculation to an initial length of the to-be-compressed data as an estimated compression ratio of the to-be-compressed data.

In conclusion, the embodiments of the present disclosure provide a method for calculating an estimated data compression ratio. In this method, to-be-compressed data is parsed to obtain a symbol sequence, a related indicator of the symbol sequence is obtained, where the related indicator is used to represent a distribution pattern of symbols in the symbol sequence, an estimated coding length obtained after the to-be-compressed data is coded using a specified coding mode is calculated according to the related indicator, and a ratio of the estimated coding length obtained by calculation to an initial length of the to-be-compressed data is used as an estimated compression ratio of the to-be-compressed data. In this solution, an estimated data compression ratio is calculated using a related indicator that represents a distribution pattern of symbols in a symbol sequence, where the related indicator that represents the distribution pattern of the symbols in the symbol sequence is relatively closely related to the estimated data compression ratio, thereby overcoming a disadvantage of relatively low accuracy of a current process for calculating an estimated data compression ratio.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing devices such that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of the present disclosure have been described, persons skilled in the art can make changes and modifications to these embodiments once they learn the basic inventive concept. Therefore, the following claims are intended to be construed as to cover the preferred embodiments and all changes and modifications falling within the scope of the present disclosure.

Obviously, persons skilled in the art can make various modifications and variations to the embodiments of the present disclosure without departing from the spirit and scope of the embodiments of the present disclosure. The present disclosure is intended to cover these modifications and variations provided that they fall within the scope of protection defined by the following claims and their equivalent technologies.

What is claimed is:

1. A method for calculating an estimated data compression ratio, comprising:
 parsing to-be-compressed data to obtain a symbol sequence;
 obtaining a related indicator of the symbol sequence, wherein the related indicator is used to represent a distribution pattern of symbols in the symbol sequence;

calculating, according to the related indicator, an estimated coding length obtained after the to-be-compressed data is coded using a specified coding mode; and using a ratio of the estimated coding length obtained by calculation to an initial length of the to-be-compressed data as an estimated compression ratio of the to-be-compressed data.

2. The method according to claim 1, wherein the related indicator comprises at least one of a cardinality of a symbol set or a symbol frequency set, wherein the symbol set comprises all symbols that exist in the symbol sequence, wherein any two symbols in the symbol set are different, wherein the cardinality of the symbol set is a quantity of all the symbols in the symbol set, and wherein a frequency in the symbol frequency set is a quantity of times each symbol in the symbol set exists in the symbol sequence.

3. The method according to claim 2, wherein calculating, according to the related indicator, the estimated coding length obtained after the to-be-compressed data is coded using the specified coding mode comprises:

calculating, according to the cardinality of the symbol set, a bit length that is needed when any symbol comprised in the symbol set is expressed using a fixed-length coding mode, wherein all bit lengths that are needed when the symbols in the symbol set are expressed using the fixed-length coding mode are equal;

determining a product of the bit length obtained by calculation and a sum of all frequencies that are comprised in the symbol frequency set; and using the determined product as a first estimated coding length, wherein the first estimated coding length is an estimated coding length obtained when the to-be-compressed data is coded using the fixed-length coding mode, and wherein all the bit lengths that are needed when all the symbols in the symbol set are expressed using the fixed-length coding mode are equal.

4. The method according to claim 2, wherein calculating, according to the related indicator, the estimated coding length obtained after the to-be-compressed data is coded using the specified coding mode comprises calculating a second estimated coding length by recursively dividing the symbol frequency set, wherein the second estimated coding length is an estimated coding length obtained after the to-be-compressed data is coded using a Huffman coding mode.

5. The method according to claim 4, wherein the calculating a second estimated coding length by recursively dividing the symbol frequency set comprises:

recursively dividing the symbol frequency set when the cardinality of the symbol set is greater than or equal to a preset division threshold to obtain at least two frequency subsets obtained after recursive division is completed;

calculating an estimated coding length obtained when a specified quantity of symbols are expressed using the Huffman coding mode for any frequency subset of the at least two frequency subsets, wherein the specified quantity is a sum of all frequencies comprised in the any frequency subset;

adding estimated coding lengths separately calculated for each frequency subset to obtain a sum of the estimated coding lengths; and using the sum of the estimated coding lengths as the second estimated coding length.

6. The method according to claim 5, wherein recursively dividing the symbol frequency set, to obtain the at least two frequency subsets obtained after recursive division is completed comprises:

repeatedly performing the following division processing for each frequency subset obtained by division:

dividing the symbol frequency set to obtain two frequency subsets; and continuing to perform division processing on the frequency subset for each frequency subset when at least one of the cardinality of the frequency subset is greater than or equal to the preset cardinality threshold or the recursively dividing level quantity is less than the preset level quantity threshold; and stopping the division when a cardinality of the frequency subset obtained by division is less than a preset cardinality threshold or when a recursively dividing level quantity reaches a preset level quantity threshold.

7. The method according to claim 6, wherein dividing the symbol frequency set to obtain two frequency subsets comprises:

determining all division manners used to divide the symbol frequency set; and for each division manner, separately performing:

dividing the symbol frequency set using the division manner to obtain two frequency subsets;

determining whether any frequency comprised in a first frequency subset of the obtained two frequency subsets is greater than or equal to any frequency comprised in a second frequency subset of the obtained two frequency subsets;

determining specified division manners in all the division manners, wherein in any division manner of the specified division manners, any frequency comprised in a first frequency subset of obtained two frequency subsets is greater than or equal to any frequency comprised in a second frequency subset of the obtained two frequency subsets;

calculating a difference between a sum of all frequencies comprised in a first frequency subset of two frequency subsets obtained in this division manner and a sum of all frequencies comprised in a second frequency subset for each division manner of the specified division manners;

determining a minimum difference in all obtained differences; and using two frequency subsets obtained by division in a division manner corresponding to the minimum difference as the two frequency subsets obtained by dividing the symbol frequency set.

8. The method according to claim 6, wherein dividing the symbol frequency set to obtain two frequency subsets comprises:

sorting all frequencies comprised in the symbol frequency set;

sequentially dividing the symbol frequency set obtained after sorting (N−1) times according to the following rule, wherein N is the cardinality of the symbol set:

using a frequency sorted in the first place in the symbol frequency set obtained after sorting, a frequency sorted in the $X^{th}$ place, and all frequencies sorted between the first place and the $X^{th}$ place as a first frequency subset obtained by division for the $X^{th}$ time, wherein X is a positive integer that is greater than or equal to 1 and is less than or equal to N−1;

using a frequency sorted in the last place in the symbol frequency set obtained after sorting, and all frequencies sorted between the $X^{th}$ place and the last place, as a second frequency subset obtained by division for the $X^{th}$ time;

calculating a difference between a sum of all frequencies comprised in a first frequency subset obtained by division for each time and a sum of all frequencies comprised in a second frequency subset; and using a first frequency subset and a second frequency subset obtained by division in a division manner corresponding to a minimum difference as the two frequency subsets obtained by dividing the symbol frequency set.

9. The method according to claim 5, wherein the calculating an estimated coding length obtained when a specified quantity of symbols are expressed using the Huffman coding mode comprises:

for any frequency comprised in the any frequency subset, separately performing:
determining a recursively dividing level quantity corresponding to the frequency subset in which the any frequency is located;
calculating, according to the determined recursively dividing level quantity and a cardinality of the frequency subset in which the any frequency is located, an estimated bit length that is needed when a symbol corresponding to the frequency is expressed using the Huffman coding mode; and
using a product of the estimated bit length obtained by calculation and the any frequency as an estimated coding length obtained when a quantity of symbols are expressed using the Huffman coding mode, wherein the quantity is the any frequency; and
using a total estimated coding length obtained when a quantity of symbols are expressed using the Huffman coding mode as the estimated coding length obtained when the specified quantity of symbols are expressed using the Huffman coding mode, wherein the quantity is the sum of all the frequencies in the any frequency subset.

10. The method according to claim 1, wherein a data type of the to-be-compressed data is binary data, wherein the related indicator further comprises a cardinality of a token set, a token bit length, and a maximum run-length, wherein the token set comprises a symbol that is in the symbol sequence and that is different from both neighboring symbols, wherein any symbol in each group of symbols that exist continuously and repeatedly, wherein the cardinality of the token set is a quantity of all symbols in the token set, wherein the token bit length is space overheads of any token in the token set, wherein bit lengths of tokens comprised in the token set are equal, wherein a run-length comprised in a run-length set is a quantity of times a token comprised in the token set continuously exists at corresponding locations in the symbol sequence, and wherein the maximum run-length is a maximum value of quantities of times each token continuously exists at corresponding locations in the symbol sequence.

11. An apparatus for calculating an estimated data compression ratio, wherein the apparatus is configured to perform:

parse to-be-compressed data to obtain a symbol sequence;
obtain a related indicator of the symbol sequence, wherein the related indicator is used to represent a distribution pattern of symbols in the symbol sequence;
calculate, according to the related indicator, an estimated coding length obtained after the to-be-compressed data is coded using a specified coding mode; and
use a ratio of the estimated coding length obtained by calculation to an initial length of the to-be-compressed data as an estimated compression ratio of the to-be-compressed data.

12. The apparatus according to claim 11, wherein the related indicator comprises at least one of a cardinality of a symbol set or a symbol frequency set, wherein the symbol set comprises all symbols that exist in the symbol sequence, wherein any two symbols in the symbol set are different, wherein the cardinality of the symbol set is a quantity of all the symbols in the symbol set, and wherein a frequency in the symbol frequency set is a quantity of times each symbol in the symbol set exists in the symbol sequence.

13. The apparatus according to claim 12, wherein calculating the estimated coding length obtained after the to-be-compressed data is coded using the specified coding mode according to the related indicator comprises:

calculate, according to the cardinality of the symbol set, a bit length that is needed when any symbol comprised in the symbol set is expressed using a fixed-length coding mode, wherein all bit lengths that are needed when the symbols in the symbol set are expressed using the fixed-length coding mode are equal;
determine a product of the bit length obtained by calculation and a sum of all frequencies that are comprised in the symbol frequency set; and
use the determined product as a first estimated coding length, wherein the first estimated coding length is an estimated coding length obtained when the to-be-compressed data is coded using the fixed-length coding mode, wherein all the bit lengths that are needed when all the symbols in the symbol set are expressed using the fixed-length coding mode are equal.

14. The apparatus according to claim 12, wherein the apparatus is further configured to calculate a second estimated coding length by recursively dividing the symbol frequency set, wherein the second estimated coding length is an estimated coding length obtained after the to-be-compressed data is coded using a Huffman coding mode.

15. The apparatus according to claim 14, wherein calculating the second estimated coding length by recursively dividing the symbol frequency set comprises:

recursively dividing the symbol frequency set when the cardinality of the symbol set is greater than or equal to a preset division threshold to obtain at least two frequency subsets obtained after recursive division is completed;
calculating an estimated coding length obtained when a specified quantity of symbols are expressed using the Huffman coding mode for any frequency subset of the at least two frequency subsets, wherein the specified quantity is a sum of all frequencies comprised in the any frequency subset;
adding estimated coding lengths separately calculated for each frequency subset to obtain a sum of the estimated coding lengths; and
using the sum of the estimated coding lengths as the second estimated coding length.

16. The apparatus according to claim 15, wherein recursively dividing the symbol frequency set to obtain the at least two frequency subsets obtained after recursive division is completed comprises:

repeatedly performing the following division processing for each frequency subset obtained by division and stopping division until at least one of a cardinality of the frequency subset obtained by division is less than a preset cardinality threshold or until a recursively dividing level quantity reaches a preset level quantity threshold:
dividing the symbol frequency set to obtain two frequency subsets; and
returning and continuing to perform division processing on the frequency subset for each frequency subset when at least one of the cardinality of the frequency subset is greater than or equal to the preset cardinality threshold or the recursively dividing level quantity is less than the preset level quantity threshold.

17. The apparatus according to claim 16, wherein dividing the symbol frequency set to obtain two frequency subsets comprises:
determining all division manners used to divide the symbol frequency set;
for each division manner, separately performing:
dividing the symbol frequency set using the division manner to obtain two frequency subsets; and
determining whether any frequency comprised in a first frequency subset of the obtained two frequency subsets is greater than or equal to any frequency comprised in a second frequency subset of the obtained two frequency subsets;
determining specified division manners in all the division manners, wherein in any division manner of the specified division manners, any frequency comprised in a first frequency subset of obtained two frequency subsets is greater than or equal to any frequency comprised in a second frequency subset of the obtained two frequency subsets;
calculating a difference between a sum of all frequencies comprised in a first frequency subset of two frequency subsets obtained in this division manner and a sum of all frequencies comprised in a second frequency subset for each division manner of the specified division manners;
determining a minimum difference in all obtained differences; and
using two frequency subsets obtained by division in a division manner corresponding to the minimum difference as the two frequency subsets obtained by dividing the symbol frequency set.

18. The apparatus according to claim 16, wherein dividing the symbol frequency se, to obtain two frequency subsets comprises:
sorting all frequencies comprised in the symbol frequency set;
sequentially dividing the symbol frequency set obtained after sorting for each division manner of the specified division manners, wherein N is the cardinality of the symbol set:
using a frequency sorted in the first place in the symbol frequency set obtained after sorting, a frequency sorted in the $X^{th}$ place, and all frequencies sorted between the first place and the $X^{th}$ place as a first frequency subset obtained by division for the $X^{th}$ time, wherein X is a positive integer that is greater than or equal to 1 and is less than or equal to N−1; and
using a frequency sorted in the last place in the symbol frequency set obtained after sorting, and all frequencies sorted between the $X^{th}$ place and the last place as a second frequency subset obtained by division for the $X^{th}$ time;
calculating a difference between a sum of all frequencies comprised in a first frequency subset obtained by division for each time and a sum of all frequencies comprised in a second frequency subset; and
using a first frequency subset and a second frequency subset obtained by division in a division manner corresponding to a minimum difference as the two frequency subsets obtained by dividing the symbol frequency set.

19. The apparatus according to claim 15, wherein calculating the estimated coding length obtained when the specified quantity of symbols are expressed using the Huffman coding mode comprises:
for any frequency comprised in the any frequency subset, separately performing:
determining a recursively dividing level quantity corresponding to the frequency subset in which the any frequency is located;
calculating, according to the determined recursively dividing level quantity and a cardinality of the frequency subset in which the any frequency is located, an estimated bit length that is needed when a symbol corresponding to the frequency is expressed using the Huffman coding mode; and
using a product of the estimated bit length obtained by calculation and the any frequency as an estimated coding length obtained when a quantity of symbols are expressed using the Huffman coding mode, wherein the quantity is the any frequency; and
using a total estimated coding length obtained when a quantity of symbols are expressed using the Huffman coding mode as the estimated coding length obtained when the specified quantity of symbols are expressed using the Huffman coding mode, wherein the quantity is the sum of all the frequencies in the any frequency subset.

20. The apparatus according to claim 11, wherein a data type of the to-be-compressed data is binary data, wherein the related indicator further comprises a cardinality of a token set, a token bit length, and a maximum run-length, wherein the token set comprises a symbol that is in the symbol sequence and that is different from both neighboring symbols, wherein any symbol in each group of symbols that exist continuously and repeatedly, wherein the cardinality of the token set is a quantity of all symbols in the token set, wherein the token bit length is space overheads of any token in the token set, wherein bit lengths of tokens comprised in the token set are equal, wherein a run-length comprised in a run-length set is a quantity of times a token comprised in the token set continuously exists at corresponding locations in the symbol sequence, and wherein the maximum run-length is a maximum value of quantities of times each token continuously exists at corresponding locations in the symbol sequence.

* * * * *

UNITED STATES PATENT AND TRADEMARK OFFICE
CERTIFICATE OF CORRECTION

PATENT NO. : 9,722,631 B2  Page 1 of 1
APPLICATION NO. : 15/397098
DATED : August 1, 2017
INVENTOR(S) : Jiansheng Wei et al.

It is certified that error appears in the above-identified patent and that said Letters Patent is hereby corrected as shown below:

Page 2, Column 1 (56) References Cited, Foreign Patent Documents should read:
WO 2006056247 A1 6/2006

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*